United States Patent [19]
Rau

[11] Patent Number: 5,631,580
[45] Date of Patent: May 20, 1997

[54] BICMOS ECL-CMOS LEVEL CONVERTER

[75] Inventor: Martin Rau, Ulm, Germany

[73] Assignee: Deutsche Thomson-Brandt GmbH, Villingen-Schwenningen, Germany

[21] Appl. No.: 405,643

[22] Filed: Mar. 17, 1995

[30] Foreign Application Priority Data

Mar. 18, 1994 [DE] Germany .................. 44 09 453.1

[51] Int. Cl.$^6$ .............................. H03K 19/0175
[52] U.S. Cl. .............................. 326/66; 326/77
[58] Field of Search .................. 326/77, 66, 126, 326/76

[56] References Cited

U.S. PATENT DOCUMENTS

| | | | |
|---|---|---|---|
| 4,835,420 | 5/1989 | Rosky | 326/77 |
| 4,926,065 | 5/1990 | Coy et al. | 326/77 |
| 5,012,137 | 4/1991 | Muellner | 307/475 |
| 5,027,013 | 6/1991 | Coy et al. | 326/77 |
| 5,173,625 | 12/1992 | Uedam et al. | 307/475 |
| 5,329,183 | 7/1994 | Tamegaya | 326/66 |
| 5,428,312 | 6/1995 | Higeta | 326/77 |

FOREIGN PATENT DOCUMENTS

| | | |
|---|---|---|
| 0353508 | 2/1990 | European Pat. Off. . |
| 0417786 | 3/1991 | European Pat. Off. . |
| 0485291 | 5/1992 | European Pat. Off. . |
| 4127805 | 3/1992 | Germany . |
| 4331542 | 3/1994 | Germany . |
| 0590818 | 4/1994 | Germany . |

*Primary Examiner*—Edward P. Westin
*Assistant Examiner*—Benjamin D. Driscoll
*Attorney, Agent, or Firm*—Joseph S. Tripoli; Joseph J. Laks; Sammy S. Henig

[57] ABSTRACT

An input stage of a level converter for converting an ECL compatible signal to an MOS compatible signal is formed as a differential amplifier. The differential amplifier produces a current that is coupled directly to a first transistor of a pair of complementary transistors, during a transition interval, to turn on the first transistor. An output signal of the first transistor is fed back to a control terminal of the first transistor via a first inverter. Consequently, the first transistor is actively turned off immediately following the transition interval. A second inverter and the first inverter form a latch for maintaining the output signal unchanged, after the first transistor is turned off.

4 Claims, 2 Drawing Sheets

BICMOS ECL-CMOS LEVEL CONVERTER

The invention relates to a circuit for amplifying a digital signal with a small logic level swing, for example, amplifying a digital signal compatible with the emitter-coupled transistor logic (ECL), to a large level swing, compatible with the complementary metal oxide-semiconductor logic (CMOS).

Such level amplifiers are required as level converters in the combination of ECL gates and CMOS gates in one integrated circuit (IC). As is known, this technology offers the possibility of realizing time-critical signal paths by the fast ECL logic. CMOS is used for the slower sections of the circuit in order to save IC surface area and power. Since the two circuit techniques operate with different signal levels, fast level converters are required for an IC design which includes both. A particular difficulty in this case is the amplification of the small ECL signals to the larger CMOS level. It is also a time-critical criterion in the realization of RAM storage elements.

In a known amplifier circuit, operating as a fast digital level converter, the voltage amplification is performed by an input stage which is designed as a differential amplifier with bipolar transistors coupled to an output stage of the level converter. The output stage is of a CMOS configuration. The signal delay time, i.e., the period of time from the transition between, for example, a high level HIGH state and a low level LOW state at the input and that at the output, is influenced by the quiescent current consumption. The signal delay time is approximately inversely proportional to the power consumption. The last stage, or the output stage, in which a large static current flows is the most significant with regard to the power consumption and with regard to the signal delay.

In carrying out an inventive feature, complementary bipolar transistors are used for the output stage of such an amplifier circuit, operating as an ECL to CMOS level converter. The output stage is designed as a push-pull two transistor amplifier stage. Advantageously, each of these transistors is brought to saturation after a transition, as a result of which the respective turn-on time is reduced. It may be desirable to reduce the turn-off time of these transistors.

According to an aspect of the invention, control inputs of the bipolar output transistors, coupled as a push-pull amplifier stage, are directly controlled by respective output currents of an input stage, designed as a differential amplifier. Controlling the output transistors is performed in a way that may be referred to as current driving. Advantageously, no additional power consumption is required in comparison with the know level converter.

A level converter, embodying an aspect of the invention, is responsive to a digital input signal compatible with emitter-coupled transistor logic for generating an output signal having a larger magnitude compatible with complementary metal oxide semiconductor logic. A pair of complementary bipolar output transistors form an output stage of the level converter for generating the output signal. A differential amplifier forming an input stage is responsive to the input signal for generating in the differential amplifier a switching current that directly drives one of the pair of transistors when a transition in the switching current occurs.

Figure 3:
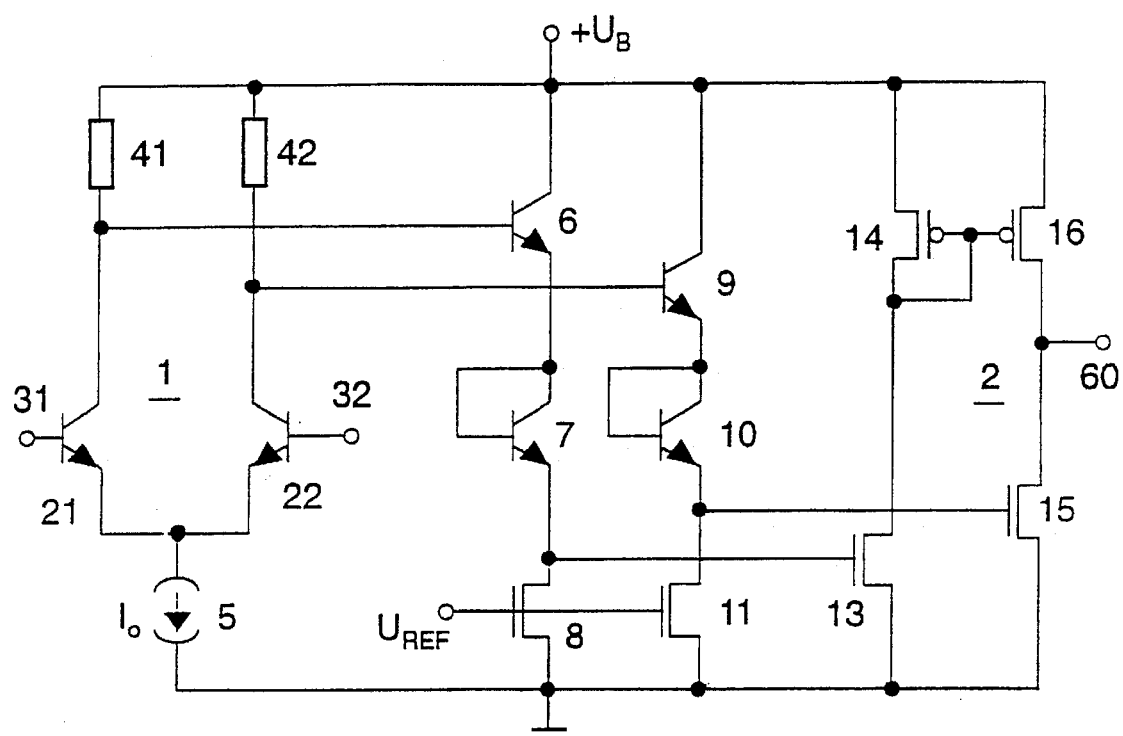
FIG. 3 shows a basic circuit diagram of a prior art digital level converter.

FIG. 3 shows a basic circuit diagram of a prior art digital level converter with an input amplifier stage 1 and with an output stage 2. Stage 2 is designed as a push-pull amplifier and has a P-channel metal oxide semiconductor (MOS) transistor 16, the source terminal of which is connected to a positive operating voltage +UB. Stage 2 has also an N-channel MOS transistor 15, the source terminal of which is connected to a ground reference potential of the positive operating voltage +UB. The drain terminals of the two output transistors 15 and 16 are interconnected and, thereby, form an output 60 of the level converter.

The input stage 1 is constructed with a differential amplifier of bipolar transistors 21 and 22 having their emitters coupled to each other. The differential amplifier is connected in series with a constant current source 5, connected to ground. The respective base terminal of each of the two transistors 21 and 22 serves in this case as the corresponding input terminals 31 and 32, respectively, of the level converter. The respective collector terminal of each of the two transistors 21 and 22 is connected via a respective resistor 41 or 42 to the positive operating voltage +UB. The two resistors 41 and 42 form the load resistances of the differential amplifier.

The two inputs 31 and 32 can be driven differentially or single ended. In a single ended configuration, a reference voltage is developed at one of the inputs 31 and 32. In order for the differential amplifier to carry out a corresponding voltage amplification of the relatively small level swing of the ECL signal fed to the inputs 31 and 32, without the transistors being saturated thereby, the input signal level is lowered with respect to the customary ECL levels. Such signal level is lowered using one or two forward diode voltages (of about 0.8 volt each) in, for example, a preceding, series-connected emitter-follower stages (not shown).

The driving of the input signal of each of the two output transistors 15 and 16 is performed substantially via a corresponding pair of emitter-follower stages. This pair of emitter-follower stages is formed by a pair of bipolar transistors 6 and 9, respectively. The collector of each of transistors 6 and 9 is coupled to the positive operating voltage +UB. The emitter of transistor 6 or 9 is coupled to ground via a series connection comprising a corresponding transistor 7 or 10, operating as a diode, and a corresponding constant current source 8 or 11. The constant current sources 8 and 11 are each formed by an N-channel MOS transistor, the respective source terminal of which is connected to ground. The signal drive to the gate terminal of the output transistor 15 is performed in a direct way from the connection point of the drain terminal of the transistor 11. The signal drive to the gate terminal of the other output transistor 16 is performed from the connection point of the drain terminal of the transistor 8 via an N-channel MOS transistor 13. The drain terminal of the latter is connected to the gate terminal of the output transistor 16 and also, via a P-channel MOS transistor 14, to the positive operating voltage +UB. The drain and gate electrodes of transistor 14 are connected to each other. The drain current of transistor 13 is transferred to the output 60 via the current mirror, formed by transistors 14 and 16.

Figure 1:
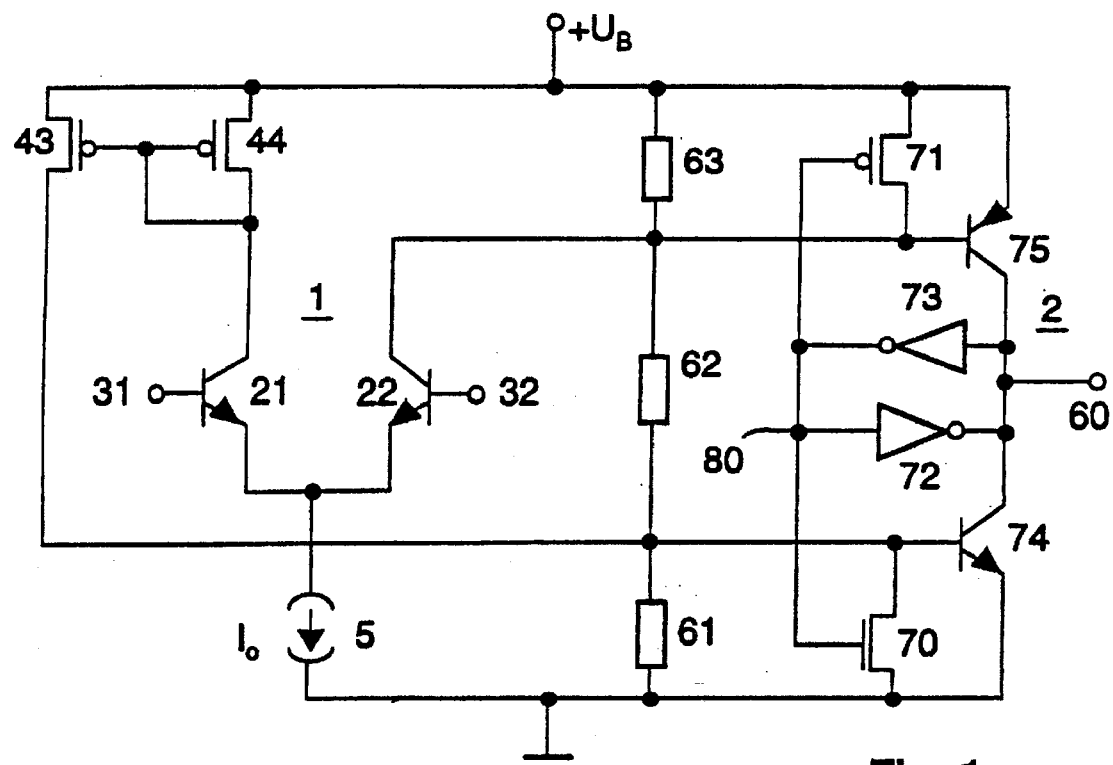
FIG. 1 shows a circuit diagram of a first exemplary embodiment of a digital level converter according to an aspect of the invention.
Figure 2:
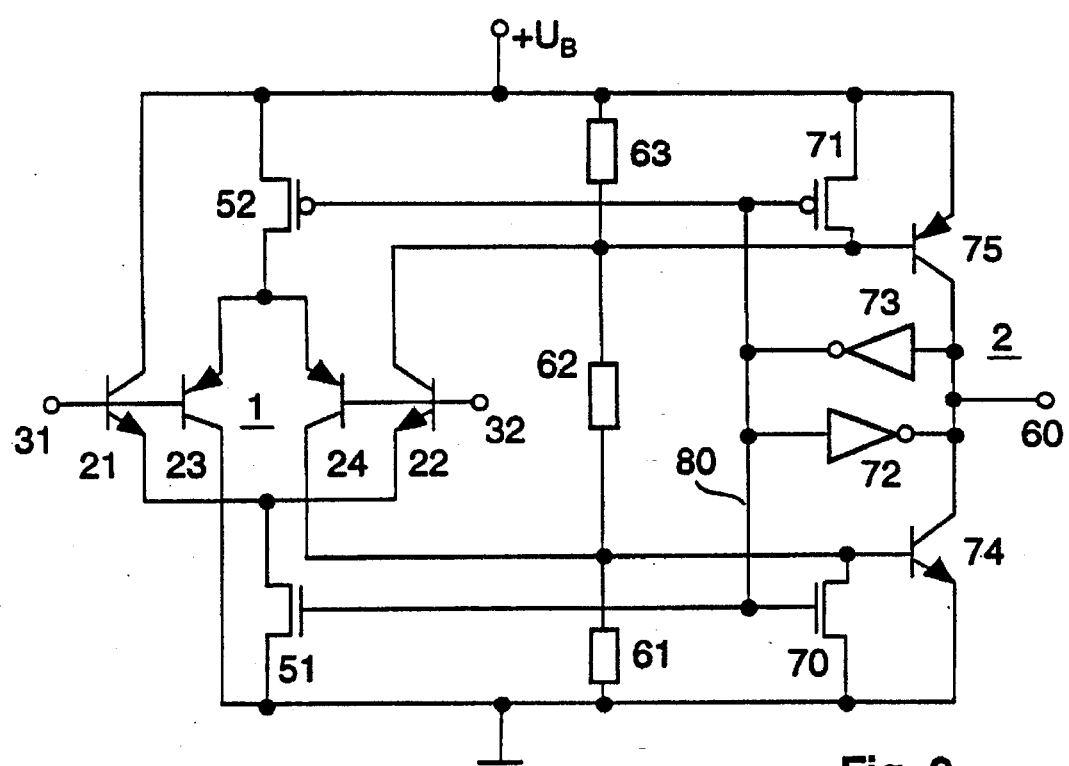
FIG. 2 shows a circuit diagram of a second exemplary embodiment of a digital level converter according to another aspect of the invention.

FIG. 1 shows a basic circuit diagram of a first exemplary embodiment of a level converter according to the invention. In FIGS. 1 to 3 circuit parts corresponding to one another are provided with the same designations. In FIG. 1, the circuit includes an input amplifier stage 1 and an output stage 2, designed as a push-pull amplifier. Stage 2 includes a bipolar PNP transistor 75, the emitter terminal of which is coupled to a positive operating voltage +UB. Stage 2 includes a bipolar NPN transistor 74, the emitter terminal of which is coupled to ground. The inter-coupled collector terminals of the two transistors 74 and 75 in this case form the output 60 of the level converter.

The input stage 1 differs from that of FIG. 3 described above essentially in that the PNP output transistor 75 is directly driven by the output current of the transistor 22 in the differential amplifier of the input amplifier stage 1. The technologically faster NPN output transistor 74 is driven through a current mirror by the output current of the transistor 21. The current mirror is formed, for example, by two P-channel MOS transistors 43 and 44. The drain terminal of the MOS transistor 44 is coupled between the collector terminal of the differential amplifier transistor 21 and the positive operating voltage +UB. The drain terminal of transistor 44 is coupled to the respective gate terminals of transistors 43 and 44.

A transistor 71 or 70 is coupled in parallel to a base or input terminal of the output transistors 74 or 75, respectively. Transistors 71 and 70 are embodied, for example, as MOS transistors. Transistor 71, which is associated with the output transistor 75, is a P-channel MOS transistor and transistor 70, associated with the output transistor 74, is an N-channel MOS transistor. The two gate terminals of the two transistors 70 and 71 are coupled to each other and are also coupled to the output 60 of the level converter by parallel coupled inverters 72 and 73. Inverters 72 and 73 are coupled in opposition as a latch, the function of which is described later. For the base-emitter voltage generation of the bipolar output transistors 74, 75, in the inactive state, a voltage divider which includes resistances 61, 62 and 63 is provided. The voltage divider is coupled between ground and the positive operating voltage +UB. The mode of operation of the digital amplifier circuit described thus far is set forth below.

The current steered or switched over by the input amplifier stage 1 controls the complementary bipolar output transistors 74, 75 of the output stage. In this case, the base current of the PNP output transistor 75 also flows in transistor 22. Thus, the transistor 75 is driven directly. The technologically faster NPN output transistor 74, however, is driven via the current mirror. Thus, approximately the same length switching times are obtained for the rising signal edge and the falling signal edge of the output signal 60. This driving principle permits the rapid transition of the output 60. This is so because a large drive current provides for a rapid build-up of the base charge in the output transistors 74, 75, and consequently, a large collector current can flow. However, after the transition, the corresponding output transistor 74, 75 is in the saturated state.

After the transition of the output 60, the respective MOS transistors 70, 71, coupled in parallel with the respective output transistor 74, 75, divert away the control current of the respective bipolar output transistor 74, 75, respectively. The MOS transistors 70, 71 short the base-emitter junction of the respective output transistors 74, 75 so that the junction can only be saturated briefly during the signal transition. Due to the complete saturation of the bipolar output transistors 74, 75, the voltage level of output 60 reaches substantially the ground potential or the full supply voltage +UB, respectively.

The switching-over of the two bipolar output transistors 74, 75 with the cooperation of the two MOS transistors 70, 71, coupled in parallel with the respective input, is described in more detail below. It is initially assumed that the output 60 is at the HIGH state. Therefore, a junction terminal 80 of the two gate terminals of the transistors 70, 71 is at the LOW state because of the inversion in inverter 73. In this case, the inverter 72 generates the voltage level at output 60. Immediately after the transition, inverter 72 and not transistor 75 maintains the high level HIGH state at output 60. Thus, the output transistor 75 is active only during the signal edge.

When the next transition occurs, the NPN output transistor 74 is driven by a base current coupled from the current mirror. Therefore, a large collector current, which is significantly greater than the current supplied from the inverter 72, flows through the output transistor 74. The inverter 72 has substantially no effect during the transition and the voltage at output 60 can change very rapidly from the HIGH state to the LOW state. All capacitances (not shown) coupled to the output 60 can, consequently, have their charges rapidly discharged because the current produced by inverter 72 is negligible.

When the potential of the output 60 has approached the LOW state level, the inverter 73 changes state. Therefore, the potential at junction terminal 80 shifts in the direction of the HIGH state level. Therefore transistor 70, coupled in parallel with the base-emitter of the NPN output transistor 74, becomes conductive and provides a current path directly to ground to the current supplied by the current mirror. The result is that the NPN output transistor 74 is immediately brought out of the saturated operating state and is turned off. Until the next signal edge, the inverter 72, which forms a latch with inverter 73, maintains the output potential at the LOW state. The PNP output transistor 75 operates in a similar fashion when the output 60 is switched from the LOW state to the HIGH state.

FIG. 2 shows as a second exemplary embodiment similar to the digital amplifier circuit of FIG. 1, used as a level converter, with the differences noted below. In the circuit of FIG. 2, the driving of the two bipolar complementary output transistors 74 and 75 is performed by an input amplifier stage 1, which is embodied by two parallel-coupled complementary differential amplifiers. In this case, each differential amplifier is formed by a corresponding emitter-coupled bipolar transistor pair 21, 22; 23, 24. Each transistor pair 21, 22 or 23, 24 drives only a corresponding one of the two output transistors 74 and 75.

As a result, after the transition of the output 60 of the level converter, the respective differential amplifier triggering the transition is no longer required until the next transition and can be switched off from the output 60. The switching off or turn off of the no longer required differential amplifier is obtained via feedback provided by the inverter 73 and via a corresponding controlled current source 51 or 52, coupled in series with the respective emitter-coupled transistor pair 21, 22 or the pair 23, 24.

Due to this alternate switching-off of the parallel-coupled complementary differential amplifiers of the input stage 1, this circuit consumes even less power than that shown in FIG. 1. This is so because the mirrored current flowing there, during the low output level, or LOW state level, is dispensed with in this circuit. Each of the two current sources 51 and 52 is realized, for example, by a corresponding MOS transistor. The transistor 51, assigned to the emitter-coupled transistor pair 21, 22, is an N-channel MOS transistor. Whereas, the transistor 52, assigned to the emitter-coupled transistor pair 23, 24, is a P-channel MOS transistor.

The respective MOS transistor 70 or 71 coupled in parallel with the input of the corresponding output transistor 74 or 75, can be made of smaller dimensions, since it no longer conducts any static current. Consequently, the parasitic capacitance at the base terminals of the output transistor 74 or 75 can be smaller. Moreover, advantageously, more current flows into the base during the turning-on. In addition, the base-emitter residual voltage is very small. Advantageously, the respective turned-off output transistor 74 or 75, that could otherwise be conductive for a short time during the edge at the output 60 due to the parasitic base-collector capacitance, is no longer conductive. Therefore, this circuit operates even faster than that shown in FIG. 1.

The circuits shown in FIGS. 1 and 2 can be used in particular for level conversion or adaptation at the interface between ECL circuits and CMOS circuits. A further significant application is their use as a digital amplifier for reading out information from RAM chips.

What is claimed is:

1. A level converter responsive to a digital input signal compatible with emitter-coupled transistor logic for generating an output signal having a larger magnitude compatible with complementary metal oxide semiconductor logic, comprising:

a pair of complementary bipolar output transistors forming a push-pull output stage of said level converter for generating said output signal such that when one of said transistors is conductive the other one is nonconductive, and vice versa; and a differential amplifier forming an input stage responsive to said input signal for generating in said differential amplifier a switching current that directly drives one of said pair of transistors when a transition in said switching current occurs.

2. A level converter responsive to a digital input signal compatible with emitter-coupled transistor logic for generating an output signal having a larger magnitude compatible with complementary metal oxide semiconductor logic, comprising:

a pair of complementary bipolar output transistors forming an output stage of said level converter for generating said output signal; and a differential amplifier forming an input stage including a first differential amplifier responsive to said input signal for generating in said differential amplifier a switching current that directly drives one of said pair of transistors when a transition in said switching current occurs, said input stage further including a second differential amplifier to form a pair of complementary differential amplifiers, each of said differential amplifiers being responsive to said input signal and directly driving the corresponding transistor of said pair of transistors by a corresponding switching current of the corresponding differential amplifier when a transition occurs in said input signal.

3. A level converter according to claim 2 wherein said pair of differential amplifiers are coupled to a pair of current sources, respectively, and wherein a feedback signal from said output stage is coupled to said current sources for turning off one of said current sources when said output signal is at a first logic state and for turning off the other one of said current sources when said output signal is at a second logic state.

4. A level converter responsive to a digital input signal compatible with emitter-coupled transistor logic for generating an output signal having a larger magnitude compatible with complementary metal oxide semiconductor logic, comprising:

a pair of complementary bipolar output transistors forming an output stage of said level converter for generating said output signal;

a differential amplifier forming an input stage responsive to said input signal for generating in said differential amplifier a switching current that directly drives one of said pair of transistors when a transition in said switching current occurs; and a latch responsive to said output signal for turning off said one output transistor immediately after said transition and for generating said output signal when said one output transistor is turned off.

\* \* \* \* \*